United States Patent [19]
Kakihana

[11] Patent Number: 4,792,531
[45] Date of Patent: Dec. 20, 1988

[54] SELF-ALIGNED GATE PROCESS

[75] Inventor: Sanehiko Kakihana, San Francisco, Calif.

[73] Assignee: Menlo Industries, Inc., San Francisco, Calif.

[21] Appl. No.: 105,650

[22] Filed: Oct. 5, 1987

[51] Int. Cl.[4] .................. H01L 21/265; H01L 21/44; H01L 21/48

[52] U.S. Cl. .................... 437/41; 437/184; 437/176; 437/229; 437/912; 357/15; 357/22; 148/DIG. 140

[58] Field of Search ............... 437/40, 41, 44, 175, 437/176, 184, 187, 203, 235, 238, 229, 245, 912; 148/DIG. 140; 357/22 I, 22 J, 22 K, 15; 156/650, 651, 652, 653

[56] References Cited

U.S. PATENT DOCUMENTS

| | | | |
|---|---|---|---|
| 4,426,765 | 1/1984 | Shahriary et al. | 437/184 |
| 4,472,872 | 9/1984 | Toyoda et al. | 437/176 |
| 4,503,599 | 3/1985 | Ueyanagi et al. | 437/184 |
| 4,546,540 | 10/1985 | Ueyanagi et al. | 437/176 |
| 4,561,169 | 12/1985 | Miyazaki et al. | 437/41 |
| 4,642,259 | 2/1987 | Vetanen et al. | 437/184 |
| 4,670,090 | 6/1987 | Sheng et al. | 437/184 |
| 4,694,564 | 9/1987 | Enoki et al. | 437/40 |
| 4,728,621 | 3/1988 | Graf et al. | 437/41 |
| 4,731,339 | 3/1988 | Ryan et al. | 437/41 |
| 4,732,871 | 3/1988 | Buchmann et al. | 437/176 |

FOREIGN PATENT DOCUMENTS

| | | | |
|---|---|---|---|
| 0077682 | 6/1977 | Japan | 437/184 |
| 0007123 | 1/1982 | Japan | 437/184 |
| 0092265 | 6/1983 | Japan | 437/41 |
| 0123779 | 7/1983 | Japan | 437/41 |
| 0249371 | 12/1985 | Japan | 437/176 |
| 2105480 | 5/1987 | Japan | 437/184 |

OTHER PUBLICATIONS

A. Geissberger et al., "Refractory Self-Aligned Gate Process for Monolithically Combined Microwave and Digital GaAs ICs", *IEEE International Microwave Symposium Digest*, 1987 MTT-S, pp. 665-668.

*Primary Examiner*—Brian E. Hearn
*Assistant Examiner*—M. Wilczewski
*Attorney, Agent, or Firm*—David W. Heid; Alan H. MacPherson; Paul J. Winters

[57] ABSTRACT

Disclosed is a process for producing a field effect transistor to provide a uniformity of spacing between the gate and drain as well as the gate and source.

5 Claims, 3 Drawing Sheets

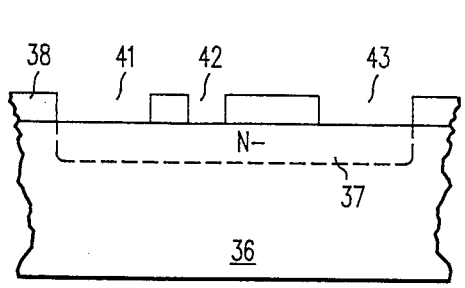
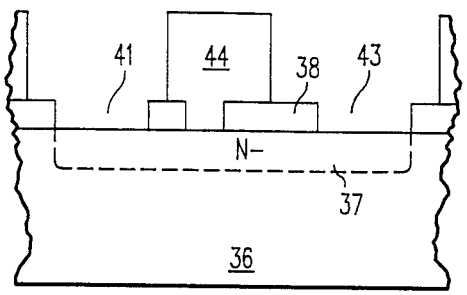
FIG. 4e  FIG. 4f
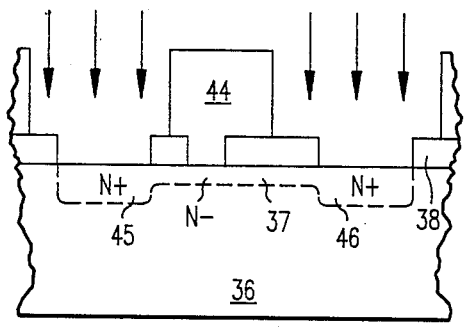
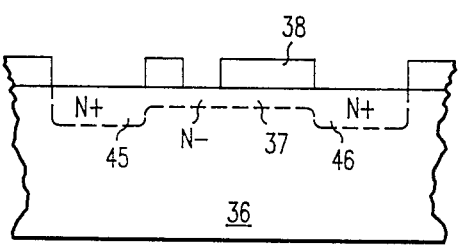
FIG. 4g  FIG. 4h
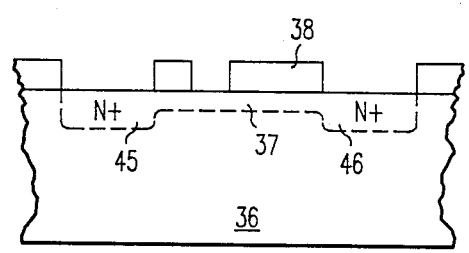
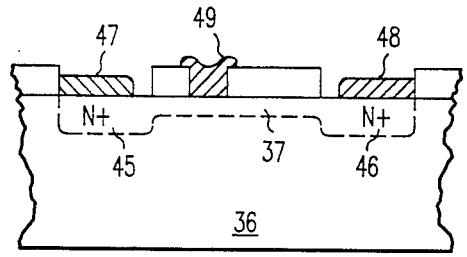
FIG. 4i  FIG. 4j

SELF-ALIGNED GATE PROCESS

BACKGROUND OF THE INVENTION

1. Field of the Invention

This invention relates to the field of field effect transistor devices, and more particularly to the production of gallium arsenide field effect transistor devices and the formation of such devices.

2. Description of the Prior Art

In producing GaAs field effect transistors, one of the most significant factors limiting the saturated output power of such devices is the drain-gate avalanche breakdown voltage. To have a sufficiently high drain-gate breakdown voltage, a minimum drain-to-gate spacing must be maintained. In an interdigitated layout, such as that utilized in achieving high power and high frequency, misalignment in the lithography process produces a distribution of drain-gate spacing. The smallest drain-gate spacing in this distribution limits the breakdown voltage of the entire field effect transistor (FET). Although it is possible to design a layout such that the minimum drain-gate spacing produced by the maximum alignment error will give adequate breakdown voltage, in such a layout the drain-source spacing, and therefore the channel resistance, can be unnecessarily large. The larger the channel resistance, the larger the knee voltage (the voltage at which the linear region and the saturation region of an FET intersect). The saturated output power of a GaAs FET is proportional to the difference between the drain-gate breakdown voltage and the knee voltage for a given drain-source saturation current. Accordingly, the power performance of a GaAs FET is compromised when a large drain-source spacing is chosen to compensate for alignment errors. Additionally, in such a layout the finger in the interdigitated layout with the smallest drain-gate spacing has the largest gate-source spacing. A large gate-source spacing translates into large source resistance, which in turn degrades the frequency response of the FET.

In a monolithic microwave integrated circuit (MMIC) where more than one FET is utilized, and where wafer yield is of ultimate importance, since few MMICs can be produced per wafer, the non-uniform and non-reproduceable frequency and power performance can cause unnecessary design iterations and unacceptable yield. Therefore, the distribution of drain-gate spacing in an MMIC has to be kept small.

Prior art attempts to produce satisfactory devices avoiding the above noted problems have not been totally satisfactory. The first of those attempts may be referred to generally as the symmetrically self-aligned gate process. This technique is commonly utilized in digital GaAs integrated circuit devices. A symmetrically selfaligned gate process is illustrated in FIGS. 1a and 1b. Referring to FIG. 1a, the process begins with a body 1 which includes a lightly doped N-type channel region 2, extending into body 1 from surface 3. On surface 3 of body 1, a refractory metal, such as TiW is applied by the process of evaporation or sputtering, and patterned by either lift-off or etching to form gate 5 at the center of region 2. Following the formation of gate 5, a photoresist 6 is applied and patterned as illustrated in FIG. 1b, forming openings 7 and 8. Following the patterning process to open areas 7 and 8, an ion implant process is performed to provide the highly doped N-type source region 9 and drain region 10 in body 1. It will be noted that the structure provides two heavily doped regions (source region 9 and drain region 10) symmetrically about gate 5, with both the source region 9 and drain region 10 being in close proximity to the sides of gate 5. This small separation between gate 5 and the heavily doped drain region 10 makes the drain-gate breakdown voltage unacceptably low for power applications.

A second prior art technique for producing a gate for an integrated circuit device is illustrated in FIGS. 2a–2c. Referring to FIG. 2a, the process begins with body 12, which may be of GaAs material, into which a lightly N doped region 13 has been formed. To provide source and drain regions, first photoresist 14 is applied to surface 15 and patterned to produce openings 16 and 17. Openings 16 and 17 are produced by using a first mask through which light is shined to activate photoresist 14, after which photoresist is removed in the exposed areas to produce the structure of FIG. 2a. Following the production of opening 16 and 17, an ion implantation step is performed to produce the highly doped N-type source region 18 and highly doped N-type drain region 19. Following the production of the source and drain regions, first photoresist 14 is removed and second photoresist 20 is applied to surface 15 and patterned as indicated in FIG. 2c to provide opening 21 for the deposition of a gate on surface 15. The patterning of the device in FIG. 2c involves the use of a second mask to expose photoresist 20 and define opening 21 through which gate material will be deposited. The introduction of a second mask to define the location of the gate leads to the difficulties of gate-to-drain region 19 being varying distances apart. As pointed out above, the gate-to-drain spacing is quite important and the utilization of a second mask to produce a device in the manner illustrated in FIGS. 2a through 2c is highly frought with difficulties since the second mask alignment is very critical.

A third category of processes utilized in the production of GaAs FET devices is referred to as the off-set self-aligned gate-source process. This process involves a slight variation on the prior art processes illustrated in FIGS. 1a and 1b, and is not totally satisfactory, as will be more fully described below, as mask alignment problems (particularly with the second mask) produces non-uniform gate-to-drain region distribution on the surface of a wafer. This technique is described in an article entitled "A Refractory Self-Aligned Gate Process for Monolithically Combined Microwave and Digital GaAs ICs", published in the IEEE Internatinal Microwave Symposium Digest, 1987 MTT-S, pp. 665–668, by A. Geissberger, R. Sadler, E. Griffin, I. Bahl, H. Singh and M. Drinkwine. The following is a simplified explanation of the off-set self-aligned gatesource process using FIGS. 3a, b and c to describe such process. The process begins, referring to FIG. 3a, with body 24, having a lightly doped N-type region 25 extending into body 24 from surface 26. On surface 26 refractory gate material is applied and patterned by a first photomask to form the gate structure 29. The next step in the process involves covering surface 26 with a photoresist 30, which as will be noted in FIG. 3b extends above the top of gate 29. Second photoresist 30 being patterned by a second mask to produce openings 31 and 32 which will provide the to-be-formed source region (below opening 31) and drain region (below opening 32). Since a second mask is required to define the location of the drain region (which will be below opening 32), this leads to the possibility of additional misalignment and across the surface of the wafer gate-to-drain opening distance will vary providing the above described undesirable varying distribution of gate-to-drain region. Following the patterning and removal of second photoresist 30 illustrated in FIG. 3b, the source and drain regions are doped, typically by ion implantation, to produce the structure illustrated in FIG. 3c having source region 33 and drain region 34. Although utilizing the processes of FIG. 3a through 3c provide an asymmetrical configuration, that is drain region 34 is further displaced from the closer edge of gate 29 than is source region 33 from the nearest edge of gate 29, as indicated above, this process requires the utilization of a second mask to produce opening 32 and the utilization of a second mask with its attendant misalignment problems can result in a non-uniform distribution of the gate-to-drain region spacings across the surface of the wafer. Accordingly, although this is an improvement, it does not totally satisfy the requirements for a process providing uniform spacing across the surface of a wafer.

SUMMARY OF THE INVENTION

It is an object of the present invention to provide a process for producing a field effect transistor device which has both the drain-to-gate spacing and the gate-to-source spacing defined in such a manner that they are self-aligned, as well as to do so and provide uniformity of such spacing across a wafer when a plurality of such devices are produced on the wafer. It is another object of the present invention to provide a process for producing an FET device in which the alignment error due to lithography is totally removed from the definition of the drain-to-gate and gate-to-source spacing.

In accordance with one feature of the present invention, a process is provided for producing a field effect semiconductor device in a body of semiconductor material, which process comprises the steps of: forming a region of first conductivity type extending into said body from a surface; applying a dielectric layer on said surface above said first region; applying a first layer of resist on said dielectric layer; patterning said first layer of resist to define a source implant area, a drain implant area and the location for a gate and removing the resist material in said defined locations to expose the surface of said dielectric layer in said defined locations; removing the dielectric material in said exposed areas to define on said surface of said body the locations for said gate, source implant area and drain implant area; removing said first resist; applying a second layer of resist, and patterning said second layer of resist to permit removal of said resist from said source implant area and said drain implant area; removing said second resist in said patterned areas to expose on said surface said source implant area and said drain implant area; subjecting said exposed areas to ion implantation to form a drain region and a source region in said body; removing said second resist; annealing said body to activate the implanted ions; and forming a gate on said surface in said gate defined location.

In accordance with another feature of the present invention, the above mentioned process is practiced through the utilization of photoresist materials for the first and second resists.

In accordance with yet another feature of the invention, the first above mentioned process is practiced wherein the step of moving the dielectric material comprises reactive ion etching utilizing $CHF_3$.

In accordance with another feature of the invention, the process utilizes ion implantation wherein Si ions are implanted at an energy level of 100 KeV at a density of $1 \times 10^{13}/cm^2$.

In accordance with yet another feature of the invention, the step of annealing comprises the steps of bringing the temperature of the body to 850° C. and maintaining said body at that temperature for at least thirty minutes.

BRIEF DESCRIPTION OF THE DRAWINGS

Other objects and advantages of the invention will become apparent from a study of the specification and drawings in which FIGS. 4a through 4j illustrate processes in accordance with the present invention.

DETAILED DESCRIPTION OF THE INVENTION

The present invention will be illustrated in connection with producing a field effect transistor in a gallium arsenide wafer body. However, it wil be appreciated that the invention may be practiced in various other types of devices.

Figure 1A:
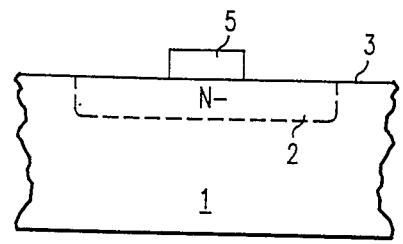
FIGS. 1 through 3 illustrate prior art processes for producing semiconductor devices.
Figure 1B:
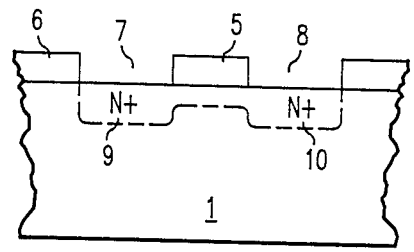
Figure 2A:
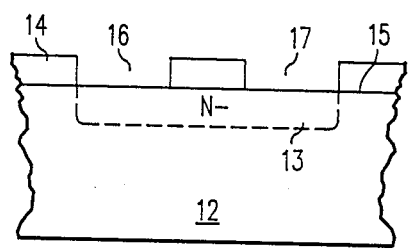
Figure 2B:
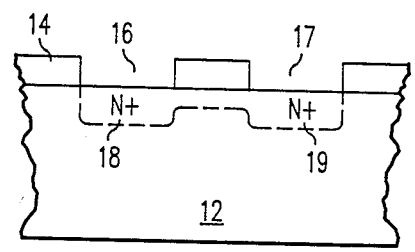
Figure 2C:
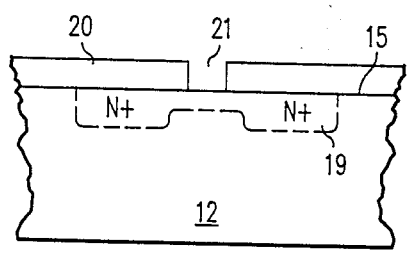
Figure 3A:
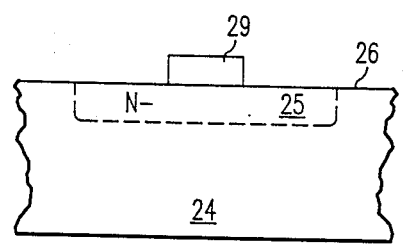
Figure 3B:
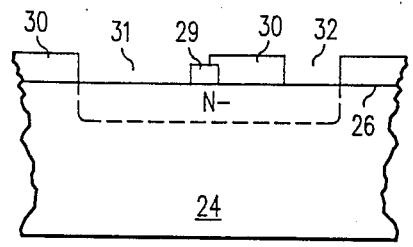
Figure 3C:
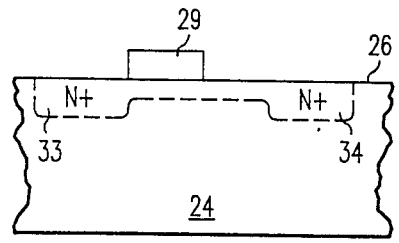
Figure 4A:
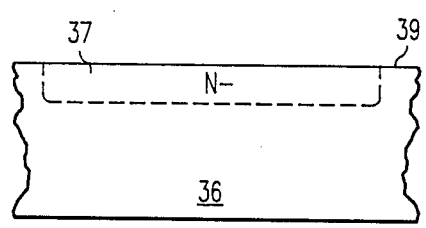
Figure 4B:
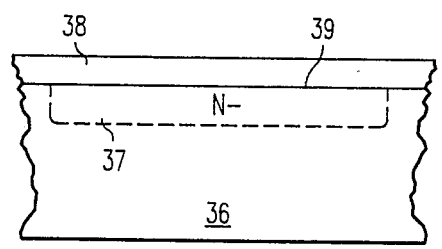

With the foregoing in mind, the explanation of the processes begin by reference to FIG. 4a wherein GaAs body 36 is illustrated in cross section and includes a lightly doped N-type channel 37, which may be formed in any convention manner, such as ion implantation or isolating an epitaxial layer. Following the formation of the lightly doped N-type channel region 37, dielectric layer 38, which may be of silicon dioxide material, is deposited on surface 39 of wafer 36 and extends above lightly doped N-type channel region 37. It has been found that it is preferable to deposit dielectric layer 38 to a thickness of approximately 5000 Å and to do so by chemical vapor deposition or plasma enhanced chemical vapor deposition. It is of course apparent to those skilled in the art that other types of dielectric materials may be utilized and if so, their thickness may not necessariliy be 5000 Å. The significance of the thickness of dielectric layer 38 is that it should be thick enough to mask the channel region, which will be between the to-be-formed source and drain regions, during the ion implantation step of FIG. 4f, which will be described subsequently. After deposit of dielectric layer 38, a layer of photoresist material 40 is applied to the surface of dielectric layer 38. Photoresist 40 may be, for example, type AZ4070, which is available from American Hoescht Corporation, 3070 Highway 22 West, Somerville, N.J., 08876, this material being applied to a thickness of approximately 7000 Å. Next, a first mask is utilized to define source implant area 41, gate opening 42 and drain implant area 43. Photoresist 40 is patterned by conventional photolithography processes and the photoresist removed, both by processes well known to those skilled in the art. It will be appreciated by reference to FIG. 4c that the distance between the drain implant area opening 43 and gate opening implant area 42 is greater than the distance between source implant area 41 and gate opening 42. As will be recalled from the earlier explanation, it is desirabel to have a greater distance between the gate and drain than between the gate and source to provide the advantageous electrical characteristics, particularly for a microwave device.

Figure 4C:
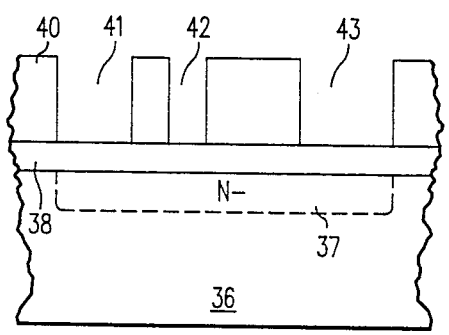
Figure 4D:
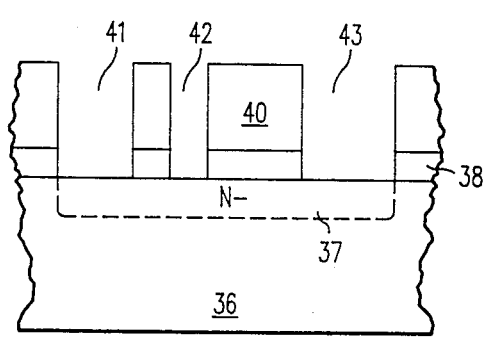

Following the patterning and removal of photoresist in the selected areas yielding the structure in FIG. 4c, a reactive ion etch process is performed to etch away the exposed dielectric layer 38 in areas 41, 42 and 43, producing the structure illustrated in 4d. It has been found that a preferable reactive ion etch is performed using $CHF_3$ gas since it has excellent etch selectivity of silicon dioxide over photoresist and GaAs. An optical interference pattern produced by a focus laser may be used to monitor the end point of the etch. This etch process would be performed at a pressure approximately 30 mTorr at room temperature.

After completing the reactive ion etching, the work piece is removed from the etching chamber and photoresist 40 is removed with acetone, or other suitable solvent depending on the photoresist utilized. Next, a second photoresist 44 is applied to surface 39 and the remaining portions of dielectric layer 38, and utilizing a second mask is patterned using a conventional photoresist process followed by removal of photoresist in the defined areas to leave exposed areas 41 and 43 (which will be used to define the source and drain regions of the device) and cover opening 42, which will later be utilized in the production of the final device where the gate will be formed. It will be appreciated that the alignment tolerance at this step is rather forgiving since the photoresist 44 may vary in position significantly without exposing gate opening 42. The photoresist 44 which is preferred in the process is AZ4110 which is available from the American Hoescht Corporation.

With the source implant area 41 and drain implant area 43 now open, the source and drain ion implantation may be performed, which step is illustrated in FIG. 4g. It has been found preferable to perform this step using Si ions implanted at an energy level of 100 KeV and at a dosage of $1 \times 10^{13}/cm^2$. This ion implantation forms highly doped N-type source region 45 and highly doped N-type drain region 46, which are illustrated in FIG. 4g. Following the ion implantation step, second photoresist 44 is removed by acetone and the structure is descummed in oxygen plasma, which produces the structure illustrated in FIG. 4h. Following the removal of the photoresist and descumming of the surface, an annealing step is performed to activate the ion implants. A typical annealing involves raising the structure to a temperature of 850° C. for thirty minutes and using an InAs wafer in the annealing furnace to generate arsenic overpressure to prevent decomposition of the GaAs body 36. Following the annealing step, conventional processes are utilized to form ohmic contacts 47 and 48 for source and drain regions, 45 and 46, respectively. Deposition of gate metallization 49 completes the device.

From the foregoing process description, it will be appreciated that the completed structure was produced in such a manner that the separation of the drain region 46 from the adjacent edge of gate 49 was fixed by the first mask, and hence a uniform separation will be the result over the entire surface of a wafer when this process is utilized in producing a wafer having numerous FET devices.

Various modifications and changes to the foregoing will be apparent to those skilled in the art without departing from the spirit and scope of the invention. It is of course understood that the invention is not limited by the foregoing and is only defined by the following claims.

I claim:

1. A process for producing a field effect semiconductor device in a body of semiconductor material, comprising the steps of:
    forming a region of first conductivity type extending into said body from a surface;
    applying a dielectric layer on said surface above said first region;
    applying a first layer of resist on said dielectric layer;
    patterning said first layer of resist to define a source implant area, a drain implant area and the location for a gate and removing the resist material in said defined locations to expose the surface of said dielectric layer in said defined locations;
    removing the dielectric material in said exposed areas to define on said surface of said body the locations for said gate, source implant area and drain implant area;
    removing said first resist;
    applying a second layer of resist, and patterning said second layer of resist to permit removal of said resist from said source implant area and said drain implant are;
    removing said second resist in said patterned areas to expose on said surface said source implant area and said drain implant area;
    subjecting said exposed areas to ion implantation to form a drain region and a source region in said body;
    removing said second resist;
    annealing said body to activate the implanted ions; and
    forming a gate on said surface in said gate defined location.

2. The process of claim 1, wherein said first and second resists are comprised of photoresist materials.

3. The process of claim 2, wherein said step of removing said dielectric material further comprises reactive ion etching of said exposed areas of dielectric material with $CHF_3$.

4. The process of claim 1, wherein said step of ion implantation further comprises the steps of implanting Si ions at an energy level of 100 KeV at a density of $1 \times 10^{13}/cm^2$.

5. The process of claim 4, wherein said annealing step further comprises the steps of bringing temperature of said body to 850 degrees centigrade and maintaining said body at said temperature for at least thirty minutes.

* * * * *